United States Patent [19]

Hada et al.

[11] Patent Number: 5,902,713
[45] Date of Patent: May 11, 1999

[54] CHEMICAL-SENSITIZATION PHOTORESIST COMPOSITION

[75] Inventors: Hideo Hada, Hiratsuka; Hiroyuki Yamazaki, Kanagawa-ken; Yoshiki Sugeta, Yokohama; Hiroshi Komano; Kiyoshi Ishikawa, both of Kanagawa-ken, all of Japan

[73] Assignee: Tokyo Ohka Kogyo Co., Ltd., Japan

[21] Appl. No.: 08/762,920

[22] Filed: Dec. 10, 1996

[30] Foreign Application Priority Data

Dec. 20, 1995 [JP] Japan ..................................... 7-332301
Jul. 1, 1996 [JP] Japan ..................................... 8-171108

[51] Int. Cl.$^6$ ..................................... G03C 5/00
[52] U.S. Cl. ..................................... 430/270.1; 430/281.1; 430/325; 430/919; 430/921
[58] Field of Search ................. 522/126, 59; 430/270.1, 430/325, 281.1, 919, 921

[56] References Cited

U.S. PATENT DOCUMENTS

| | | | |
|---|---|---|---|
| 4,123,255 | 10/1978 | Freenor, III et al. | 71/103 |
| 4,451,286 | 5/1984 | Martin | 71/107 |
| 4,540,598 | 9/1985 | Berner et al. | 427/54.1 |
| 4,736,055 | 4/1988 | Dietliker et al. | 560/13 |
| 5,019,488 | 5/1991 | Mammato et al. | 430/325 |
| 5,580,695 | 12/1996 | Murata et al. | 430/270.1 |
| 5,627,011 | 5/1997 | Munzel et al. | 430/270.1 |

FOREIGN PATENT DOCUMENTS

| | | |
|---|---|---|
| 0044115 | 1/1982 | European Pat. Off. . |
| 0241423 | 10/1987 | European Pat. Off. . |
| 0361907 | 4/1990 | European Pat. Off. . |
| 361907 | 4/1990 | European Pat. Off. ........ G03F 7/004 |
| 0571330 | 11/1993 | European Pat. Off. . |

*Primary Examiner*—John A. McPherson
*Assistant Examiner*—Rosemary Ashton
*Attorney, Agent, or Firm*—Wenderoth, Lind & Ponack, L.L.P.

[57] ABSTRACT

Disclosed are novel high-sensitivity positive- and negative-working chemical-sensitization photoresist compositions capable of giving a highly heat-resistant patterned resist layer of high resolution having excellently orthogonal cross sectional profile without being influenced by standing waves. The composition contains, as an acid generating agent by irradiation with actinic rays, a specific cyano-substituted oximesulfonate compound such as α-(methylsulfonyloxyimino)-4-methoxybenzyl cyanide. The advantages obtained by the use of this specific acid-generating agent is remarkable when the film-forming resinous ingredient has such a molecular weight distribution that the ratio of the weight-average molecular weight to the number-average molecular weight does not exceed 3.5.

10 Claims, No Drawings

CHEMICAL-SENSITIZATION PHOTORESIST COMPOSITION

BACKGROUND OF THE INVENTION

The present invention relates to a chemical-sensitization photoresist composition or, more particularly, to a photoresist composition, which may be of the positive-working type or negative-working type, containing a unique acid-generating agent capable of releasing an acid when exposed to actinic rays. The photoresist composition gives a patterned resist layer having high heat resistance and high resolution with a high photosensitivity of the photoresist composition without being affected by the influences of standing waves so that the patterned resist layer has an excellently orthogonal cross section.

It is a trend in recent years in the manufacturing technology of various electronic devices such as semi-conductor devices involving the process of photolithographic patterning works that so-called chemical-sensitization photoresist compositions are acquiring more and more prevalence by replacing those of the traditional types by virtue of the high sensitivity and high resolving power as compared with conventional photoresist compositions. The chemical-sensitization photoresist composition mentioned above contains a radiation-sensitive acid-generating agent which is a compound capable of releasing an acid when exposed to actinic rays so as to catalyze the solubilizing reaction and crosslinking reaction of the resinous ingredient in the positive- and negative-working photoresist compositions, respectively.

The chemical-sensitization photoresist compositions include two classes of positive-working and negative-working ones depending on the activity of the radiation-released acid either to increase or to decrease, respectively, the solubility of the film-forming resinous ingredient in the composition in an aqueous alkaline solution as a developer. In other words, the chemical-sensitization photoresist composition is positive-working when the film-forming resinous ingredient therein is imparted with an increase in the solubility in the alkaline developer solution and is negative-working when the film-forming resinous ingredient therein is imparted with a decrease in the solubility in the alkaline developer solution.

Accordingly, a positive-working chemical-sensitization photoresist composition usually contains a polyhydroxystyrene and the like of which a part of the hydroxy groups are substituted by solubility-suppressing acid-dissociable protective groups such as tert-butoxycarbonyl and tetrahydropyranyl groups while the film-forming resinous ingredient in the negative-working chemical-sensitization photoresist composition is usually a combination of an acid-crosslinkable melamine resin, urea resin and the like with an alkali-soluble resin such as novolac resins and polyhydroxystyrene resins optionally protected for a part of the hydroxy groups with the solubility-suppressing groups.

It is known that the resinous ingredient mentioned above in the photoresist composition should have a narrow molecular weight distribution expressed by the ratio of the weight-average molecular weight Mw to the number-average molecular weight Mn, i.e. Mw:Mn, in order to ensure high resolution of patterning and high heat resistance of the patterned resist layer.

The acid-generating agent heretofore proposed or currently used in chemical-sensitization photoresist compositions includes oximesulfonate compounds as disclosed in Japanese Patent Kokai 1-124848, 2-154266, 2-161444 and 6-67433, of which those oximesulfonate compounds having a cyano group in the molecule are preferred as exemplified by α-(p-toluenesulfonyloxyimino)benzyl cyanide, α-(4-chlorobenzenesulfonyloxyimino)benzyl cyanide, α-(4-nitrobenzenesulfonyloxyimino)benzyl cyanide, α-(4-nitro-2-trifluoromethylbenzenesulfonyloxyimino)benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, benzenesulfonyloxyimino-2-thienyl acetonitrile, α-(4-dodecylbenzenesulfonyloxyimino)benzyl cyanide, α-(p-toluenesulfonyloxyimino)-4-methoxybenzyl cyanide, α-(4-dodecylbenzenesulfonyloxyimino)-4-methoxybenzyl cyanide, p-toluenesulfonyloxyimino-3-thienyl acetonitrile and the like.

It is noted that each of the above named cyano group-containing oximesulfonate compounds has two aromatic groups in a molecule, one, substituting the α-carbon atom to which the cyano group —CN is bonded and, the other, forming the sulfonate ester. While the acid released from such a dually aromatic oximesulfonate compound by the irradiation with actinic rays is therefore an aromatic sulfonic acid such as benzenesulfonic acid and p-toluenesulfonic acid, a chemical-sensitization photoresist composition formulated with such an oximesulfonate compound and a resinous ingredient having a narrow molecular weight distribution mentioned above has a defect that the patterning of the resist layer is susceptible to the influences of standing waves so that the cross sectional profile of the patterned resist layer is not exactly orthogonal but has wavy or undulated side lines.

SUMMARY OF THE INVENTION

The present invention accordingly has an object to provide a novel and improved chemical-sensitization photoresist composition, which may be positive-working or negative-working, free from the above described problems and disadvantages in the prior art chemical-sensitization photoresist compositions by using, as the acid-generating agent, a unique cyano group-containing oximesulfonate compound, by virtue of which the photoresist composition has a very high sensitivity to actinic rays and is capable of forming a patterned resist layer having an excellently orthogonal cross sectional profile and high heat resistance as well as high resolution of the pattern without being influenced by the standing waves.

Thus, the present invention provides, as the first aspect of the invention, a positive-working chemical-sensitization photoresist composition which comprises, in the form of a uniform solution in an organic solvent:

(a1) 100 parts by weight of an alkali-soluble hydroxy group-containing resin such as a polyhydroxystyrene, of which at least a part of the hydroxy groups are substituted each by an acid-dissociable substituent group and the ratio of the weight-average molecular weight to the number-average molecular weight Mw:Mn does not exceed 3.5; and (b) from 0.1 to 30 parts by weight of a cyano group-containing oximesulfonate compound, as an acid-generating agent, represented by the general formula $$R^1—C(CN)=N—O—SO_2—R^2, \qquad (I)$$

in which $R^1$ is a monovalent aromatic group and $R^2$ is an alkyl group having 1 to 4 carbon atoms and unsubstituted or substituted by halogen atoms.

The present invention further provides, as the second aspect of the invention, a negative-working chemical-sensitization photoresist composition which comprises, in the form of a uniform solution in an organic solvent:

(a2) 100 parts by weight of an alkali-soluble resin such as a polyhydroxystyrene, copolymer of hydroxystyrene and styrene and novolac resin, of which the ratio of the weight-average molecular weight to the number-average molecular weight Mw:Mn does not exceed 3.5;

(b) from 0.1 to 30 parts by weight of a cyano group-containing oximesulfonate compound, as an acid-generating agent, represented by the general formula $$R^1—C(CN)=N—O—SO_2—R^2, \quad (I)$$

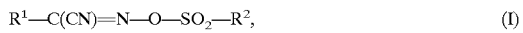

in which $R^1$ is a monovalent aromatic group and $R^2$ is an alkyl group having 1 to 4 carbon atoms and unsubstituted or substituted by halogen atoms; and (c) from 3 to 70 parts by weight of an acid-crosslinkable resin such as melamine resins, urea resins and guanamine resins.

Some of the cyano group-containing oximesulfonyl compounds represented by the general formula (I) are novel and not known in the prior art. Novel species of the cyano group-containing oximesulfonyl compounds can be represented by the general formula

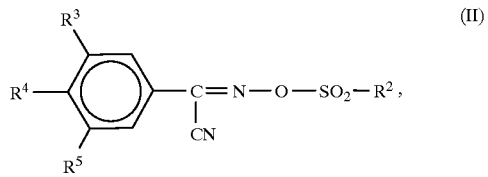

(II)

in which $R^2$ has the same meaning as defined above and each of $R^3$, $R^4$ and $R^5$ is, independently from the others, an atom or group selected from the group consisting of a hydrogen atom, alkyl groups having 1 to 4 carbon atoms, alkoxy group having 1 to 4 carbon atoms and atoms of halogen, e.g., fluorine, chlorine and bromine, with the proviso that at least one of $R^3$, $R^4$ and $R^5$ in a molecule is an alkyl group, alkoxy group or halogen atom.

DETAILED DESCRIPTION OF THE PREFERRED EMBODIMENTS

As is described above, both of the positive-working and negative-working photoresist compositions provided by the present invention are characterized by the use of a specific cyano group-containing oximesulfonate compound of the general formula (I) which has, different from conventional dually aromatic cyano group-containing oximesulfonate compounds mentioned above, only one aromatic group bonded to the same carbon atom as that to which the cyano group —CN is bonded. It is a quite unexpected discovery that replacement of the conventional dually aromatic cyano group-containing oximesulfonate compound with the above defined specific oximesulfonate compound has an effect to overcome the problems and disadvantages in the chemical-sensitization photoresist compositions in the prior art. The improvement accomplished by the present invention is particularly remarkable when the film-forming resinous ingredient, i.e. component (a1) or (a2), has a narrow molecular weight distribution as defined by the ratio of the weight-average molecular weight Mw to the number-average molecular weight Mn not exceeding 3.5.

The film-forming resinous ingredient as the component (a1) in the positive-working chemical-sensitization photoresist composition is an alkali-soluble resin having hydroxy groups, a part of which are substituted each by an acid-dissociable substituent group. The alkali-soluble resin suitable as the base material of the component (a1) includes homopolymers of hydroxystyrene, copolymers of hydroxystyrene and styrene or a styrene derivative, of which the molar fraction of the hydroxystyrene moiety is at least 70%, and copolymers of hydroxystyrene and (meth)acrylic acid or a derivative thereof as well as copolymers of (meth)acrylic acid and a derivative thereof, of which a part of the carboxylic hydroxy groups are substituted by the acid-dissociable groups. Among the above named hydroxy group-containing resins, homopolymers of hydroxystyrene and copolymers of styrene and hydroxystyrene are preferred.

The above mentioned styrene derivative to be copolymerized with hydroxystyrene includes α-methylstyrene, 4-methylstyrene, 2-methylstyrene, 4-methoxystyrene, 4-chlorostyrene and the like. The (meth)acrylic acid derivative mentioned above includes esters such as methyl (meth)acrylate, ethyl (meth)acrylate, 2-hydroxyethyl (meth)acrylate and 2-hydroxypropyl (meth)acrylate, (meth)acrylamide, (meth)acrylonitrile and the like.

The acid-dissociable group substituting a part of the hydroxy groups in the above named hydroxy-containing resins to form the component (a1) in the inventive positive-working photoresist composition is selected from the group consisting of tert-alkyloxycarbonyl groups such as tert-butoxycarbonyl and tert-amyloxycarbonyl groups, tert-alkyloxycarbonylalkyl groups such as tert-butoxycarbonylmethyl group, tert-alkyl groups such as tert-butyl group, alkoxyalkyl groups such as ethoxyethyl and methoxypropyl groups, cyclic acetal groups such as tetrahydropyranyl and tetrahydrofuranyl groups, benzyl group and trimethylsilyl group, though not particularly limitative thereto.

The degree of substitution by the above mentioned acid-dissociable groups for the hydroxy groups in the hydroxy-containing alkali-soluble resin is preferably in the range from 1 to 60% by moles or, more preferably, in the range from 10 to 50% by moles.

In the formulation of the positive-working chemical-sensitization photoresist composition of the present invention, the component (a1) is preferably a polyhydroxystyrene resin of which a part of the hydroxy groups are protected by the substitution of tert-butoxycarbonyl groups, tetrahydropyranyl group, alkoxyalkyl groups, e.g., ethoxyethyl and methoxypropyl groups, or a combination thereof.

The component (a2) in the negative-working chemical-sensitization photoresist composition of the invention is an alkali-soluble resin selected from the group consisting of novolac resins as a condensation product of a phenolic compound such as phenol, m- and p-cresols, xylenols, trimethyl phenols and the like and an aldehyde compound such as formaldehyde and the like in the presence of an acidic catalyst, hydroxystyrene-based polymers such as homopolymers of hydroxystyrene, partially or completely hydrogenated polyhydroxystyrenes, copolymers of hydroxystyrene with styrene or a derivative thereof and copolymers of hydroxystyrene and (meth)acrylic acid or a derivative thereof and (meth)acrylic resins such as copolymers of (meth)acrylic acid and a derivative thereof. The polyhydroxystyrene can optionally be substituted by the above mentioned acid-dissociable substituents for a part of the hydroxy groups. The above mentioned styrene derivative and (meth)acrylic acid derivatives can be exemplified by the same monomeric compounds as given above for the component (a1).

Polyhydroxystyrene resins of a narrow molecular weight distribution having the value of Mw:Mn not exceeding 3.5 or, in particular, about 2.0 are available on the market as a "monodisperse" resin and can be used as such as the base material of the component (a1) or as the component (a2). No commercial products are available, on the other hand, for the novolac resin to be used as the component (a2) having the Mw:Mn value of 3.5 or smaller so that a conventional novolac resin of broader molecular weight distribution is subjected to a treatment of fractional precipitation to selectively remove the low molecular-weight fractions to such an extent that the fractionated polymer may have a Mw:Mn value not exceeding 3.5.

The alkali-soluble resin as the component (a2) is selected preferably from the group consisting of cresol novolac resins, polyhydroxystyrene resins and copolymers of hydroxystyrene and styrene as well as polyhydroxystyrene resins of which a part of the hydroxy groups are substituted by tert-butoxycarbonyl groups. These alkali-soluble resins can be used either singly or as a combination of two kinds or more according to need.

As is described before, the resin as the component (a1) or (a2) is required to have a narrow molecular weight distribution with a Mw:Mn value as small as possible or not exceeding 3.5 in order to ensure high heat resistance of the patterned resist layer and high pattern resolution with the photoresist composition. The Mw:Mn value should be preferably 2.5 or smaller or, more preferably, 1.5 or smaller for the polyhydroxystyrene resins and should be preferably 3.0 or smaller for the novolac resins in view of the difference in the molecular weight distribution between different types of resins as a consequence of the quite different molecular structures. The weight-average and number-average molecular weights of the resins can be determined by the gel permeation chromatographic (GPC) method by making reference to polystyrene samples having known molecular weights.

The component (b) as an essential ingredient in both of the positive-working and negative-working chemical-sensitization photoresist compositions of the present invention is an acid generating agent which is a specific cyano group-containing oximesulfonate compound represented by the above given general formula (I). In the formula, $R^1$ is a monovalent aromatic group such as phenyl, naphthyl, furyl and thienyl groups, optionally, substituted on the aromatic nucleus by one or more of substituents such as halogen, e,g., chlorine, bromine and iodine, atoms, alkyl groups having 1 to 4 carbon atoms, alkoxy groups having 1 to 4 carbon atoms and nitro groups. The group denoted by $R^2$ is a lower alkyl group having 1 to 4 carbon atoms, which can be a normal or branched alkyl group, including methyl, ethyl, n-propyl, isopropyl, n-butyl, isobutyl, sec-butyl and tert-butyl groups as well as a halogen-substituted lower alkyl group having 1 to 4 carbon atoms such as chloromethyl, trichloromethyl, trifluoromethyl and 2-bromopropyl groups.

While, as is mentioned before, the conventional dually aromatic cyano group-containing oximesulfonate compound releases an aromatic sulfonic acid by the irradiation with actinic rays, the acid released from the oximesulfonate compound of the general formula (I) by the irradiation with actinic rays is a lower alkyl sulfonic acid or a halogenated lower alkyl sulfonic acid. It is the advantage of the present invention that the chemical-sensitization photoresist composition comprising this acid generating agent in combination with the component (a1) or with the components (a2) and (c) is capable of giving a patterned resist layer having excellent heat resistance, pattern resolution and sensitivity to actinic rays with an excellently orthogonal cross sectional profile of the patterned resist layer.

Though not fully clear, the mechanism leading to the above mentioned unexpected improvement accomplished by the invention is presumably that, in contrast to the aromatic sulfonic acid generated in a conventional photoresist composition, which is poorly susceptible to thermal diffusion in the post-exposure baking treatment of the resist layer resulting in a wavy form of the cross sectional profile of the patterned resist layer due to the relatively large molecular dimension, in particular, in the resinous layer consisting of a polymeric resin of a narrow molecular weight distribution, the (halogenated) lower alkyl sulfonic acid having a smaller molecular dimension generated in the inventive photoresist composition is more diffusible in the resinous layer in the course of the post-exposure baking treatment to accomplish an excellent cross sectional profile of the patterned resist layer.

Examples of the cyano group-containing oximesulfonate compound of the general formula (I) include:

α-(methylsulfonyloxyimino)benzyl cyanide;
α-(methylsulfonyloxyimino)-4-methoxybenzyl cyanide;
α-(trifluoromethylsulfonyloxyimino)benzyl cyanide;
α-(trifluoromethylsulfonyloxyimino)-4-methoxybenzyl cyanide;
α-(ethylsulfonyloxyimino)-4-methoxybenzyl cyanide;
α-(propylsulfonyloxyimino)-4-methylbenzyl cyanide;
α-(isopropylsulfonyloxyimino)-4-methoxybenzyl cyanide;
α-(butylsulfonyloxyimino)-4-methoxybenzyl cyanide;
α-(methylsulfonyloxyimino)-4-bromobenzyl cyanide;
and the like. Among the above named compounds, the first mentioned α-(methylsulfonyloxyimino)benzyl cyanide is a known compound disclosed in U.S. Pat. No. 4,451,286 but the other compounds are each a novel compound not known in the prior art nor described in any literatures.

As to the synthetic method for the preparation of the cyano group-containing oximesulfonate compounds of the general formula (I), a method similar to the method for the preparation of the dually aromatic cyano group-containing oximesulfonate compounds, as disclosed in Japanese Patent Kokai 1-124848, 2-154266 and 6-67433, is applicable here, though not particularly limitative thereto. Namely, the compound can be obtained by the esterification reaction between an oxime group-containing compound and sulfonic acid chloride in an organic solvent such as tetrahydrofuran, N,N-dimethyl formamide, N,N-dimethyl acetamide, N-methyl pyrrolidone and the like in the presence of a basic catalyst or an acid acceptor such as pyridine, triethylamine and the like. The oxime group-containing compound as one of the starting reactants in the above mentioned esterification reaction can be prepared by a known method described in The Systematic Identification of Organic Compounds, page 181 (1980, John Wiley & Sons), Die Makromolekulare Chemie, volume 108, page 170 (1967), Organic Syntheses, volume 59, page 95 (1979) and elsewhere.

In the formulation of the inventive chemical-sensitization photoresist composition, the above named oximesulfonate compounds can be used either singly or as a combination of two kinds or more according to need. Although the preferable combination of two kinds or more of the oximesulfonate compounds depends on various factors such as the thickness of the resist layer, conditions of the post-exposure baking treatment, intervention of an anti-reflection coating layer between the substrate surface and the resist layer and so on, it is particularly preferable in the negative-working chemical-sensitization photoresist compositions of the invention, in particular, to use a combination of α-(methylsulfonyloxyimino)benzyl cyanide and α-(methylsulfonyloxyimino)-4-methoxybenzyl cyanide in a weight ratio of 1:2 to 2:1.

In the positive-working photoresist composition of the invention comprising the resinous ingredient as the component (a1) and the acid-generating agent as the component (b), an acid is generated from the component (b) in the areas of the photoresist layer irradiated with actinic rays so that the acid-dissociable substituent groups in the component (a1) are dissociated to regenerate the hydroxy groups in the resin molecules resulting in an increase in the alkali-solubility of the component (a1) in the development treatment to selectively remove the resist layer in the exposed areas giving a positively patterned resist layer.

In the negative-working photoresist composition of the invention comprising the alkali-soluble resinous ingredient as the component (a2), the acid-generating agent as the component (b) and the acid-crosslinkable resinous ingredient as the component (c), an acid is also generated from the component (b) in the areas of the photoresist layer irradiated with actinic rays so that the acid-crosslinkable resinous ingredient serves for crosslinking of the component (a2) to decrease the alkali-solubility of the resist layer in the aqueous alkaline developer solution resulting in selective removal of the resist layer in the unexposed areas to give a negatively patterned resist layer.

The acid-crosslinkable resinous ingredient as the component (c), which serves as a crosslinking agent for the component (a2), in the negative-working photoresist composition of the invention, is not particularly limitative and can be freely selected from those used in conventional negative-working chemical-sensitization photoresist compositions. Examples of the acid-crosslinkable resinous material as the component (c) include amino resins such as melamine resins, urea resins, guanamine resins, glycoluryl-formaldehyde resins, succinylamide-formaldehyde resins, ethyleneurea-formaldehyde resins and the like having hydroxy or alkoxy groups. These resinous compounds can be readily obtained by the reaction of melamine, urea, guanamine, glycoluryl, succinylamide or ethyleneurea with formaldehyde in boiling water to effect methylolation or further by the alkoxylation reaction of the methylolated resin with a lower alcohol. Melamine resins and urea resins are preferred either alone or as a combination. Commercial products of such resins are available on the market including, for example, those sold under the trade names of Nikalacs Mx-750 and Mw-30 as examples of melamine resins and Mx-290 as an example of urea resins (each a product by Sanwa Chemical Co.). These resinous compounds as the component (c) can be used either singly or as a combination of two kinds or more according to need.

Besides the above named resinous compounds preferred as the component (c), certain benzene compounds having alkoxy groups such as 1,3,5-tris(methoxymethoxy)benzene, 1,2,4-tris(isopropoxymethoxy) benzene, 1,4-bis(sec-butoxymethoxy)benzene and the like and certain phenolic compounds having alkoxy groups and hydroxy groups such as 2,6-di(hydroxymethyl)-p-cresol, 2,6-di(hydroxymethyl)-p-tert-butyl phenol and the like can be used as the component (c).

It is important that the above described essential ingredients, i.e. components (a1) and (b) or components (a2), (b) and (c), are contained in specified weight proportions in each of the inventive positive-working and negative-working photoresist compositions. Namely, the amount of the component (b) is in the range from 0.1 to 30 parts by weight or, preferably, from 1 to 20 parts by weight per 100 parts by weight of the component (a1) or (a2), respectively, in respect of obtaining good balance of the pattern-forming behavior, uniformity of the resist layer and developability. When the amount of the component (b) is too small relative to the component (a1) or (a2), no complete patterning of the resist layer can be accomplished with the composition while, when the amount thereof is too large, a decrease is caused in the uniformity of the resist layer formed on the substrate surface along with a decrease in the developability of the resist layer not to give an excellently patterned resist layer.

The amount of the component (c) compounded in the negative-working photoresist composition of the invention is in the range from 3 to 70 parts by weight or, preferably, from 10 to 50 parts by weight per 100 parts by weight of the component (a2) in respect of obtaining good balance in the properties of photosensitivity, uniformity of the resist layer and developability. When the amount of the component (c) is too small relative to the component (a2), the photoresist composition cannot be imparted with high photosensitivity to actinic rays while, when the amount thereof is too large, a decrease is caused in the uniformity of the resist layer formed on the substrate surface and in the developability.

It is usual that the chemical-sensitization photoresist composition is used in the form of a uniform solution prepared by dissolving the above described essential ingredients and optional additives in an organic solvent. Examples of suitable organic solvents include ketone compounds such as acetone, methyl ethyl ketone, cyclohexanone, methyl isoamyl ketone, 2-heptanone and the like, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers of the above named glycols and glycol monoacetates and the like, cyclic ether compounds such as dioxane and the like and ester compounds such as methyl lactate, ethyl lactate, methyl acetate, ethyl acetate, butyl acetate, methyl pyruvate, ethyl pyruvate, methyl methoxypropionate, ethyl ethoxypropionate and the like. These organic solvents can be used either singly or as a mixture of two kinds or more according to need.

It is of course optional that the photoresist composition of the invention is admixed according to need with various kinds of optional additives having compatibility with the essential ingredients and conventionally used in photoresist compositions including, for example, auxiliary resins to improve the film properties of the resist layer, plasticizers, stabilizers, coloring agents, surface active agents and so on.

The photolithographic procedure the patterning of a resist layer on a substrate surface using the inventive photoresist composition can be conventional as in the prior art. Namely, the surface of a substrate such as a semiconductor silicon wafer is uniformly coated with the photoresist composition in the form of a solution on a suitable coating machine such as spinners followed by drying of the coating layer to form a photoresist layer which is patternwise exposed through a pattern-bearing photomask to actinic rays such as ultraviolet light, deep ultraviolet light, excimer laser beams and the like or irradiated with electron beams by patternwise scanning to form a latent image of the pattern. After a post-exposure baking treatment of the resist layer, the latent image is subjected to a development treatment by using an aqueous alkaline solution of, for example, tetramethylammonium hydroxide in a concentration of 1 to 10% by weight as a developer followed by rinse with water and drying to give a resist layer patterned with high fidelity to the photomask pattern.

In the following, the positive-working and negative-working chemical-sensitization photoresist compositions of the invention are described in more detail by way of examples as preceded by the description of Synthesis Examples for the preparation of several compounds used as the component (b) in the Examples. In the following description, the term of "parts" always refers to "parts by weight".

SYNTHESIS EXAMPLE 1

α-(Methylsulfonyloxyimino)-4-methoxybenzyl cyanide was prepared in the following manner. Thus, 51.0 g (0.29 mole) of α-hydroxyimino-4-methoxybenzyl cyanide and a solution prepared by dissolving 44.0 g (0.43 mole) of triethylamine in 400 ml of tetrahydrofuran were introduced into a reaction vessel to form a uniform solution which was chilled to and kept at −5° C. Into the solution in the reaction vessel were added dropwise 36.5 g (0.32 mole) of mesyl chloride over a period of 2 hours under agitation. The reaction mixture in the vessel was agitated at −5° C. for 3 hours and then at about 10° C. for additional 2 hours. The reaction mixture was freed from tetrahydrofuran as the solvent by distillation under reduced pressure at 30° C. to give 73.6 g of a solid residue as a crude product which was purified by repeating recrystallization from acetonitrile to give 47.5 g of a white crystalline product having a melting point of 116° C., which could be identified to be the target compound from the results of the analysis described below. The above mentioned yield of the product corresponds to 64.5% of the theoretical value.

The infrared absorption spectrum of the above obtained product compound had peaks at wave numbers of 1187 $cm^{-1}$, 1265 $cm^{-1}$, 1378 $cm^{-1}$, 1606 $cm^{-1}$ and 2238 $cm^{-1}$. The proton nuclear magnetic resonance ($^1$H-NMR) spectrum of the compound in acetone-$d_6$ had peaks at δ=3.48 ppm, 3.93 ppm, 7.12 ppm and 7.90 ppm. The ultraviolet absorption spectrum of the compound in propyleneglycol monomethyl ether as the solvent had absorption bands at $\lambda_{max}$=233 nm and 324 nm with a molar absorption coefficient of ε=8100 and 13800, respectively.

SYNTHESIS EXAMPLE 2

α-(Ethylsulfonyloxyimino)-4-methoxybenzyl cyanide was prepared in substantially the same manner as in Synthesis EXAMPLE 1 described above excepting replacement of 36.5 g (0.32 mole) of mesyl chloride with 40.1 g (0.32 mole) of ethanesulfonyl chloride. The yield of the crude solid product was 75.0 g, from which 62.1 g of a white crystalline product having a melting point of 102° C. were obtained by repeating recrystallization from acetonitrile, which could be identified to be the target compound from the results of the analysis described below. The above mentioned yield of the product corresponds to 80.6% of the theoretical value.

The infrared absorption spectrum of the above obtained product compound had peaks at wave numbers of 1178 $cm^{-1}$, 1267 $cm^{-1}$, 1375 $cm^{-1}$, 1606 $cm^{-1}$ and 2238 $cm^{-1}$. The $^1$H-NMR spectrum of the compound in acetone-$d_6$ had peaks at δ=1.47 ppm, 3.68 ppm, 3.93 ppm, 7.12 ppm and 7.89 ppm. The ultraviolet absorption spectrum of the compound in propyleneglycol monomethyl ether as the solvent had absorption bands at $\lambda_{max}$=233 nm and 325 nm with a molar absorption coefficient of ε=7400 and 12500, respectively.

SYNTHESIS EXAMPLE 3

α-(n-Butylsulfonyloxyimino)-4-methoxybenzyl cyanide was prepared in substantially the same manner as in Synthesis Example 1 described above excepting replacement of 36.5 g (0.32 mole) of mesyl chloride with 50.0 g (0.32 mole) of 1-butanesulfonyl chloride. The yield of the crude solid product was 90.0 g, from which 52.3 g of a white crystalline product having a melting point of 71° C. were obtained by repeating recrystallization from acetonitrile, which could be identified to be the target compound from the results of the analysis described below. The above mentioned yield of the product corresponds to 55.3% of the theoretical value.

The infrared absorption spectrum of the above obtained product compound had peaks at wave numbers of 1186 $cm^{-1}$, 1268 $cm^{-1}$, 1369 $cm^{-1}$, 1606 $cm^{-1}$ and 2238 $cm^{-1}$. The $^1$H-NMR spectrum of the compound in acetone-$d_6$ had peaks at δ=0.96 ppm, 1.52 ppm, 1.89 ppm, 3.65 ppm, 3.95 ppm, 7.14 ppm and 7.89 ppm. The ultraviolet absorption spectrum of the compound in propyleneglycol monomethyl ether as the solvent had absorption bands at $\lambda_{max}$=233 nm and 325 nm with a molar absorption coefficient of ε=8000 and 13600, respectively.

SYNTHESIS EXAMPLE 4

α-(Isopropylsulfonyloxyimino)-4-methoxybenzyl cyanide was prepared in substantially the same manner as in Synthesis Example 1 described above excepting replacement of 36.5 g (0.32 mole) of mesyl chloride with 45.5 g (0.32 mole) of 2-propanesulfonyl chloride. The yield of the crude solid product was 88.0 g, from which 55.2 g of a white crystalline product having a melting point of 72° C. were obtained by repeating recrystallization from acetonitrile, which could be identified to be the target compound from the results of the analysis described below. The above mentioned yield of the product corresponds to 61.2% of the theoretical value.

The infrared absorption spectrum of the above obtained product compound had peaks at wave numbers of 1186 $cm^{-1}$, 1267 $cm^{-1}$, 1368 $cm^{-1}$, 1606 $cm^{-1}$ and 2238 $cm^{-1}$. The $^1$H-NMR spectrum of the compound in acetone-$d_6$ had peaks at δ=1.52 ppm, 3.93 ppm, 3.95 ppm, 7.13 ppm and 7.87 ppm. The ultraviolet absorption spectrum of the compound in propyleneglycol monomethyl ether as the solvent had absorption bands at $\lambda_{max}$=233 nm and 324 nm with a molar absorption coefficient of ε=6800 and 11000, respectively.

SYNTHESIS EXAMPLE 5

α-(Methylsulfonyloxyimino)benzyl cyanide was prepared in the following manner. Thus, 52.5 g (0.36 mole) of α-hydroxyiminobenzyl cyanide and a solution prepared by dissolving 44.0 g (0.43 mole) of triethylamine in 400 ml of tetrahydrofuran were introduced into a reaction vessel to form a uniform solution which was chilled to and kept at −5° C. Into the solution in the reaction vessel were added dropwise 49.0 g (0.43 mole) of mesyl chloride over a period of 2 hours under agitation. The reaction mixture in the vessel was agitated at −5° C. for 3 hours and then at about 10° C. for additional 2 hours. The reaction mixture was freed from tetrahydrofuran as the solvent by distillation under reduced pressure at 30° C. to give 75.0 g of a solid residue which was purified by repeating recrystallization from acetonitrile to give 64.5 g of a white crystalline product having a melting point of 120° C., which could be identified to be the target compound from the results of the analysis described below and coincidence of the melting point with the known value reported in literatures. The above mentioned yield of the product corresponds to 80.0% of the theoretical value.

The infrared absorption spectrum of the above obtained product compound had peaks at wave numbers of 844 cm$^{-1}$, 902 cm$^{-1}$, 1191 cm$^{-1}$, 1386 cm$^{-1}$ and 2240 cm$^{-1}$. The $^1$H-NMR spectrum of the compound in acetone-d$_6$ had peaks at δ=3.50 ppm, 7.62 ppm, 7.68 ppm and 7.97 ppm. The ultraviolet absorption spectrum of the compound in propyleneglycol monomethyl ether as the solvent had absorption bands at $\lambda_{max}$=222 nm and 281 nm with a molar absorption coefficient of ε=8780 and 10800, respectively.

SYNTHESIS EXAMPLE 6

α-(Methylsulfonyloxyimino)-4-bromobenzyl cyanide was prepared in the following manner. Thus, 81.0 g (0.36 mole) of α-hydroxyimino-4-bromobenzyl cyanide and a solution prepared by dissolving 44.0 g (0.43 mole) of triethylamine in 400 ml of tetrahydrofuran were introduced into a reaction vessel to form a uniform solution which was chilled to and kept at −5° C. Into the solution in the reaction vessel were added dropwise 49.0 g (0.43 mole) of mesyl chloride over a period of 2 hours under agitation. The reaction mixture in the vessel was agitated at −5° C. for 3 hours and then at about 10° C. for additional 2 hours. The reaction mixture was freed from tetrahydrofuran as the solvent by distillation under reduced pressure at 30° C. to give 103.0 g of a solid residue which was purified by repeating recrystallization from acetonitrile to give 81.8 g of a white crystalline product having a melting point of 128° C. which could be identified to be the target compound from the results of the analysis described below. The above mentioned yield of the product corresponds to 75.0% of the theoretical value.

The infrared absorption spectrum of the above obtained product compound had peaks at wave numbers of 844 cm$^{-1}$, 902 cm$^{-1}$, 1191 cm$^{-1}$, 1380 cm$^{-1}$ and 2238 cm$^{-1}$. The $^1$H-NMR spectrum of the compound in acetone-d$_6$ had peaks at δ=3.50 ppm, 7.80 ppm and 7.88 ppm. The ultraviolet absorption spectrum of the compound in propyleneglycol monomethyl ether as the solvent had absorption bands at $\lambda_{max}$=226 nm and 292 nm with a molar absorption coefficient of ε=9270 and 13500, respectively.

EXAMPLE 1

A positive-working chemical-sensitization photoresist composition in the form of a uniform solution was prepared by dissolving, in 400 parts of propyleneglycol monomethyl ether acetate, 30 parts of a first polyhydroxystyrene having a weight-average molecular weight of 8000, of which the Mw:Mn value representing the molecular weight distribution was 1.5 and 39% of the hydroxy groups were substituted by tert-butyloxycarbonyloxy groups, 70 parts of a second polyhydroxystyrene having a weight-average molecular weight of 8000, of which the Mw:Mn value representing the molecular weight distribution was 1.5 and 39% of the hydroxy groups were substituted by ethoxyethoxy groups, 2 parts of α-(methylsulfonyloxyimino)-4-methoxybenzyl cyanide, 0.3 part of triethylamine, 0.2 part of salicylic acid and 5 parts of N,N-dimethyl acetamide followed by filtration of the solution through a membrane filter of 0.2 μm pore diameter.

A silicon wafer was uniformly coated with the thus prepared photoresist solution on a spinner followed by drying at 80° C. for 90 seconds to give a dried photoresist layer having a thickness of 0.7 μm. The resist layer was exposed to KrF excimer laser beams on a minifying projection exposure machine (Model NSR-2005EX8A, manufactured by Nikon Co.) in varied doses increased stepwise by an increment of 1 mJ/cm$^2$ followed by a post-exposure baking treatment at 110° C. for 90 seconds and then subjected to a development treatment in a 2.38% by weight aqueous solution of tetramethylammonium hydroxide at 23° C. for 65 seconds followed by rinse for 30 seconds with water and drying. The photosensitivity of the composition represented by the minimum exposure dose, at which the resist layer on the exposed areas could be completely removed by the above described development treatment, was 5 mJ/cm$^2$.

Further, a resist layer patterned in a line-and-space pattern of 0.22 μm line width formed in the same manner as above was examined with a scanning electron microscope for the cross sectional profile of the line pattern to find that the cross section was excellently orthogonal and standing upright on the substrate surface without waviness.

The heat resistance of the patterned resist layer was estimated by heating the line-patterned resist layer of 100 μm line width at varied temperatures for 5 minutes followed by the microscopic examination to detect no collapsing or deformation along the shoulders of the line-patterned resist layer when the heating temperature was 120° C. or lower.

Comparative Example 1

The formulation of the positive-working chemical-sensitization photoresist composition and the evaluation procedures of the same were substantially the same as in Example 1 excepting for the replacement of the first polyhydroxystyrene with the same amount of a third polyhydroxystyrene having a weight-average molecular weight of 8000, of which the Mw:Mn value representing the molecular weight distribution was 4.5 and 39% of the hydroxy groups were substituted by tert-butyloxycarbonyloxy groups, replacement of the second polyhydroxystyrene with the same amount of a fourth polyhydroxystyrene having a weight-average molecular weight of 8000, of which the Mw:Mn value representing the molecular weight distribution was 4.5 and 39% of the hydroxy groups were substituted by ethoxyethoxy groups and replacement of α-(methylsulfonyloxyimino)-4-methoxybenzyl cyanide with the same amount of α-(p-toluenesulfonyloxyimino)-4-methoxybenzyl cyanide.

The results of the evaluation tests were that the photosensitivity of the composition was 4 mJ/cm$^2$ and the heat resistance test of the patterned resist layer indicated that collapsing along the shoulders of the line-patterned resist layer was found when the heating temperature was 120° C. while the cross sectional profile of the line-patterned resist layer of 0.23 μm line width examined with a scanning electron microscope was wavy indicating a strong influence of standing waves.

Comparative Example 2

The formulation of the positive-working chemical-sensitization photoresist composition and the evaluation procedures of the same were substantially the same as in Example 1 except for the replacement of α-(methylsulfonyloxyimino)-4-methoxybenzyl cyanide with the same amount of α-(p-toluenesulfonyloxyimino)-4-methoxybenzyl cyanide.

The results of the evaluation tests were that the photosensitivity of the composition was 5 mJ/cm$^2$ and the heat resistance test of the patterned resist layer indicated that no collapsing along the shoulders of the line-patterned resist layer was found when the heating temperature was 120° C. or lower while the cross sectional profile of the line-patterned resist layer of 0.22 μm line width examined with a scanning electron microscope was wavy indicating a strong influence of standing waves.

Comparative Example 3

The formulation of the positive-working chemical-sensitization photoresist composition and the evaluation procedures of the same were substantially the same as in Example 1 except for the replacement of the first polyhydroxystyrene with the same amount of the third polyhydroxystyrene as used in Comparative Example 1 and replacement of the second polyhydroxystyrene with the same amount of the fourth polyhydroxystyrene as used in Comparative Example 1.

The results of the evaluation tests were that the photosensitivity of the composition was 4 mJ/cm$^2$ and the heat resistance test of the patterned resist layer indicated that collapsing along the shoulders of the line-patterned resist layer was found when the heating temperature was 120° C. while the cross sectional profile of the line-patterned resist layer of 0.23 μm line width examined with a scanning electron microscope was orthogonal and standing upright on the substrate surface without waviness.

EXAMPLE 2

A negative-working chemical-sensitization photoresist composition in the form of a uniform solution was prepared by dissolving, in 560 parts of propyleneglycol monomethyl ether, 100 parts of a first copolymer of a 85:15 by moles combination of hydroxystyrene and styrene having a weight-average molecular weight of 2500, of which the Mw:Mn value representing the molecular weight distribution was 1.5, 10 parts of a urea resin (Mx-290, supra), 1 part of a melamine resin (Mx-750, supra) and 3 parts of α-(methylsulfonyloxyimino)-4-methoxybenzyl cyanide.

A silicon wafer was uniformly coated with the thus prepared photoresist solution on a spinner followed by drying at 100° C. for 90 seconds to give a dried photoresist layer having a thickness of 0.7 μm. The resist layer was exposed patternwise to KrF excimer laser beams on the minifying projection exposure machine (Model NSR-2005EX8A, supra) followed by a post-exposure baking treatment at 130° C. for 90 seconds and then subjected to a development treatment in a 2.38% by weight aqueous solution of tetramethylammonium hydroxide at 23° C. for 65 seconds followed by rinse for 30 seconds with water and drying.

The minimum exposure dose representing the photosensitivity of the composition for the incipient pattern formation was 8 mJ/cm$^2$. The cross sectional profile of the line-patterned resist layer having a line width of 0.30 μm as examined on a scanning electron microscope was excellently orthogonal and standing upright on the substrate surface without waviness.

Comparative Example 4

The formulation of the negative-working chemical-sensitization photoresist composition and the evaluation procedures of the same were substantially the same as in Example 2 excepting for the replacement of the first copolymer of hydroxystyrene and styrene with the same amount of a second copolymer of hydroxystyrene and styrene in a molar ratio of 85:15 having a weight-average molecular weight of 2500, of which the Mw:Mn value representing the molecular weight distribution was 4.0 and replacement of α-(methylsulfonyloxyimino)-4-methoxybenzyl cyanide with the same amount of α-(p-toluenesulfonyloxyimino)-4-methoxybenzyl cyanide.

The results of the evaluation tests were that the photosensitivity of the composition was 10 mJ/cm$^2$ and the cross sectional profile of the line-patterned resist layer of 0.35 μm line width examined with a scanning electron microscope was wavy indicating a strong influence of standing waves. Line-patterned resist layers having a line width of 0.30 μm or smaller could not be formed on the substrate surface.

Comparative Example 5

The formulation of the negative-working chemical-sensitization photoresist composition and the evaluation procedures of the same were substantially the same as in Example 2 except for the replacement of α-(methylsulfonyloxyimino)-4-methoxybenzyl cyanide with the same amount of α-(p-toluenesulfonyloxyimino)-4-methoxybenzyl cyanide.

The results of the evaluation tests were that the photosensitivity of the composition was 12 mJ/cm$^2$ and the cross sectional profile of the line-patterned resist layer of 0.30 μm line width examined with a scanning electron microscope was wavy indicating a strong influence of standing waves.

Comparative Example 6

The formulation of the negative-working chemical-sensitization photoresist composition and the evaluation procedures of the same were substantially the same as in Example 2 except for the replacement of the first copolymer of hydroxystyrene and styrene with the same amount of the second copolymer of hydroxystyrene and styrene as used in Comparative Example 4.

The results of the evaluation tests were that the photosensitivity of the composition was 7 mJ/cm$^2$ and the cross sectional profile of the line-patterned resist layer of 0.35 μm line width examined with a scanning electron microscope was orthogonal and standing upright on the substrate surface without waviness. Line-patterned resist layers having a line width of 0.30 μm or smaller could not be formed on the substrate surface.

EXAMPLE 3

A negative-working chemical-sensitization photoresist composition in the form of a uniform solution was prepared by dissolving, in 400 parts of propyleneglycol monomethyl ether, 100 parts of a first novolac resin prepared by the condensation reaction of a 6:4 by moles combination of m- and p-cresols with formaldehyde having a weight-average molecular weight of 12000, of which the Mw:Mn value representing the molecular weight distribution was 3.5, 10 parts of the urea resin (Mx-290, supra), 1 part of the melamine resin (Mx-750, supra) and 3 parts of α-(methylsulfonyloxyimino)-4-methoxybenzyl cyanide.

A silicon wafer was uniformly coated with the thus prepared photoresist solution on a spinner followed by drying at 90° C. for 90 seconds on a hot plate to give a dried photoresist layer having a thickness of 2.0 μm. The resist layer was exposed patternwise to the i-line ultraviolet light of 365 nm wavelength on a minifying projection exposure machine (Model NSR-2005i10D, manufactured by Nikon Co.) followed by a post-exposure baking treatment at 100°

C. for 90 seconds and then subjected to a development treatment in a 2.38% by weight aqueous solution of tetramethylammonium hydroxide at 23° C. for 65 seconds followed by rinse for 30 seconds with water and drying.

The results of the evaluation tests were that the photosensitivity of the composition for the incipient pattern formation was 25 mJ/cm² and the cross sectional profile of the line-patterned resist layer of 2 μm line width examined with a scanning electron microscope was orthogonal and standing upright on the substrate surface without waviness.

Comparative Example 7

The formulation of the negative-working chemical-sensitization photoresist composition and the evaluation procedures of the same were substantially the same as in Example 3 except for the replacement of the first novolac resin with the same amount of a second novolac resin prepared from the same m- and p-cresol mixture and having a weight-average molecular weight of 10000, of which the Mw:Mn value representing the molecular weight distribution was 5.6, and replacement of α-(methylsulfonyloxyimino)-4-methoxybenzyl cyanide with the same amount of α-(p-toluenesulfonyloxyimino)-4-methoxybenzyl cyanide.

The results of the evaluation tests were that the photosensitivity of the composition was 30 mJ/cm² and the cross sectional profile of the line-patterned resist layer of 2 μm line width examined with a scanning electron microscope was wavy indicating a strong influence of standing waves.

Comparative Example 8

The formulation of the negative-working chemical-sensitization photoresist composition and the evaluation procedures of the same were substantially the same as in Example 3 except for the replacement of α-(methylsulfonyloxyimino)-4-methoxybenzyl cyanide with the same amount of α-(p-toluenesulfonyloxyimino)-4-methoxybenzyl cyanide.

The results of the evaluation tests were that the photosensitivity of the composition was 25 mJ/cm² and the cross sectional profile of the line-patterned resist layer of 2 μm line width examined with a scanning electron microscope was wavy indicating a strong influence of standing waves.

Comparative Example 9

The formulation of the negative-working chemical-sensitization photoresist composition and the evaluation procedures of the same were substantially the same as in Example 3 except for the replacement of the first novolac resin with the same amount of the second novolac resin as used in Comparative Example 7.

The results of the evaluation tests were that the photosensitivity of the composition was 30 mJ/cm² and the cross sectional profile of the line-patterned resist layer of 2 μm line width examined with a scanning electron microscope was orthogonal and standing upright on the substrate surface without waviness.

EXAMPLE 4

A negative-working chemical-sensitization photoresist composition in the form of a uniform solution was prepared by dissolving, in 500 parts of propyleneglycol monomethyl ether acetate, 100 parts of the same copolymer of hydroxystyrene and styrene as used in Example 2, 15 parts of a melamine resin (Mw-100LM, a product by Sanwa Chemical Co.), 3 parts of α-(methylsulfonyloxyimino)benzyl cyanide and 4 parts of α-(methylsulfonyloxyimino)-4-methoxybenzyl cyanide.

A silicon wafer having an anti-reflection coating film was uniformly coated with the thus prepared photoresist solution on a spinner followed by drying at 90° C. for 90 seconds on a hot plate to give a dried photoresist layer having a thickness of 0.80 μm. The resist layer was exposed patternwise to the i-line ultraviolet light of 365 nm wavelength on the minifying projection exposure machine (Model NSR-2005i10D, supra) followed by a post-exposure baking treatment at 100° C. for 90 seconds and then subjected to a development treatment in a 2.38% by weight aqueous solution of tetramethylammonium hydroxide at 23° C. for 65 seconds followed by rinse for 30 seconds with water and drying.

The results of the evaluation tests were that the photosensitivity of the composition for the incipient pattern formation was 30 mJ/cm² and the cross sectional profile of the line-patterned resist layer of 0.30 μm line width examined with a scanning electron microscope was orthogonal and standing upright on the substrate surface without waviness.

What is claimed is:

1. A negative-working chemical-sensitization photoresist composition which comprises, in the form of a uniform solution in an organic solvent:

(a2) 100 parts by weight of an alkali-soluble resin, of which the ratio of the weight-average molecular weight to the number-average molecular weight Mw:Mn does not exceed 3.5;

(b) from 0.1 to 30 parts by weight of a cyano group-containing oximesulfonate compound, as an acid-generating agent, represented by the general formula

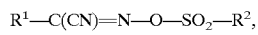

in which $R^1$ is a monovalent aromatic group and $R^2$ is an alkyl group having 1 to 4 carbon atoms unsubstituted or substituted by halogen atoms; and (c) from 3 to 70 parts by weight of an acid-crosslinkable resin.

2. The negative-working chemical-sensitization photoresist composition as claimed in claim 1 in which the acid-crosslinkable resin as the component (c) is an amino resin having hydroxy groups, alkoxy groups or a combination thereof in the molecule.

3. The negative-working chemical-sensitization photoresist composition as claimed in claim 2 in which the acid-crosslinkable resin as the component (c) is selected from the group consisting of melamine resins, urea resins and combinations thereof each having hydroxy groups, alkoxy groups or a combination thereof in the molecule.

4. The negative-working chemical-sensitization photoresist composition as claimed in claim 1 in which the alkali-soluble resin as the component (a2) is selected from the group consisting of novolac resins, homopolymers of hydroxystyrene, homopolymers of hydroxystyrene of which a part of the hydroxy groups are each substituted by an acid-dissociable group, copolymers of a styrene compound and hydroxystyrene, partially or completely hydrogenated polyhydroxystyrenes, copolymers of hydroxystyrene and (meth)acrylic acid or a derivative thereof and copolymers of (meth)acrylic acid and a derivative thereof.

5. The negative-working chemical-sensitization photoresist composition as claimed in claim 1 in which the aromatic monovalent group denoted by $R^1$ is selected from the group consisting of phenyl, naphthyl, furyl and thienyl groups unsubstituted or substituted by a halogen atom, alkyl group, alkoxy group or nitro group.

6. The positive-working chemical-sensitization photoresist composition as claimed in claim 1 in which the ratio of the weight-average molecular weight to the number-average molecular weight Mw:Mn in the component (a2) does not exceed 2.5.

7. The negative-working chemical-sensitization photoresist composition as claimed in claim 6 in which the ratio of the weight-average molecular weight to the number-average molecular weight Mw:Mn in the component (a2) does not exceed 1.5.

8. The negative-working chemical-sensitization photoresist composition as claimed in claim 1 in which the amount of the component (b) is in the range from 1 to 20 parts by weight per 100 parts by weight of the component (a2).

9. The negative-working chemical-sensitization photoresist composition as claimed in claim 1 in which the amount of the component (c) is in the range from 10 to 50 parts by weight per 100 parts by weight of the component (a2).

10. The negative-working chemical-sensitization photoresist composition as claimed in claim 1 in which the component (b) is a combination of α-(methylsulfonyloxyimino)benzyl cyanide and α-(methylsulfonyloxyimino)-4-methoxybenzyl cyanide in a weight ratio in the range from 1:2 to 2:1.

* * * * *

UNITED STATES PATENT AND TRADEMARK OFFICE
CERTIFICATE OF CORRECTION

PATENT NO. : 5,902,713
DATED : May 11, 1999
INVENTOR(S) : Hideo HADA et al.

It is certified that error appears in the above-identified patent and that said Letters Patent is hereby corrected as shown below:

Column 17, line 3, "positive" should read --negative--.

Signed and Sealed this

First Day of February, 2000

Attest:

Q. TODD DICKINSON

Attesting Officer

Acting Commissioner of Patents and Trademarks